United States Patent
Klimczak et al.

(10) Patent No.: US 10,630,836 B2
(45) Date of Patent: Apr. 21, 2020

(54) SYSTEMS AND METHODS FOR ADAPTION OF A TELEPHONIC AUDIO SIGNAL

(71) Applicant: Mimi Hearing Technologies GmbH, Berlin (DE)

(72) Inventors: Ryan Klimczak, Berlin (DE); Philipp Skribanowitz, Berlin (DE); Nicholas R. Clark, Royston (GB)

(73) Assignee: Mimi Hearing Technologies GmbH, Berlin (DE)

( * ) Notice: Subject to any disclaimer, the term of this patent is extended or adjusted under 35 U.S.C. 154(b) by 0 days.

(21) Appl. No.: 16/373,952

(22) Filed: Apr. 3, 2019

(65) Prior Publication Data
US 2020/0059556 A1   Feb. 20, 2020

Related U.S. Application Data

(60) Provisional application No. 62/719,919, filed on Aug. 20, 2018.

(30) Foreign Application Priority Data

Mar. 15, 2019   (EP) .................... 19163135

(51) Int. Cl.
  *H04M 3/42*     (2006.01)
  *G10L 21/02*    (2013.01)
  *G10L 21/038*   (2013.01)
  *H04M 1/247*    (2006.01)
  *H04M 1/725*    (2006.01)
(52) U.S. Cl.
  CPC ..... *H04M 3/42391* (2013.01); *G10L 21/0205* (2013.01); *G10L 21/038* (2013.01); *H04M 1/2475* (2013.01); *H04M 1/72591* (2013.01); *H04M 2201/40* (2013.01); *H04M 2203/556* (2013.01); *H04M 2203/558* (2013.01)

(58) Field of Classification Search
  CPC ........ H04M 3/42; H04M 1/725; H04M 1/247; G10L 21/02; G10L 21/038
  USPC ............................... 379/52, 390.01; 704/271
  See application file for complete search history.

(56) References Cited

U.S. PATENT DOCUMENTS

| 6,944,474 B2 * | 9/2005 | Rader .................... H04R 25/70 455/432.3 |
| 7,042,986 B1 * | 5/2006 | Lashley .............. H04M 1/6025 379/390.01 |
| 2010/0169091 A1 * | 7/2010 | Zurek .................... G06Q 30/02 704/235 |
| 2011/0250932 A1 * | 10/2011 | Cohen .................. H04R 1/1016 455/569.1 |
| 2014/0314261 A1 * | 10/2014 | Selig ...................... H04R 25/50 381/314 |

(Continued)

Primary Examiner — Melur Ramakrishnaiah
(74) Attorney, Agent, or Firm — Polsinelli PC

(57) ABSTRACT

Systems and methods for adaption of telephonic signal are provided. A telephonic listener's demographic information is first received. Next, a set of preset parameters are retrieved from a database based on the demographic information. The preset parameters are calculated using suprathreshold and/or threshold hearing data, which is representative of a demographic group. These preset parameters are then outputted to a sound personalization digital signal processing (DSP) algorithm. A voice signal is then processed using the sound personalization DSP and the processed voice signal is then outputted at the listener's telephonic device.

16 Claims, 17 Drawing Sheets

(56) References Cited

U.S. PATENT DOCUMENTS

2015/0011361 A1* 1/2015 Boyette .............. A63B 24/0087
  482/8
2015/0346987 A1* 12/2015 Ren .......................... G06F 1/32
  345/589

* cited by examiner

FIG 2
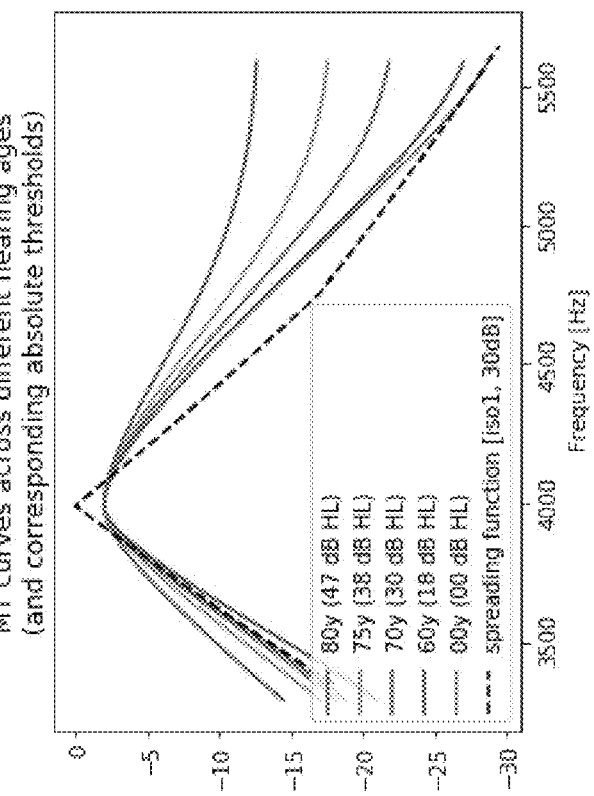
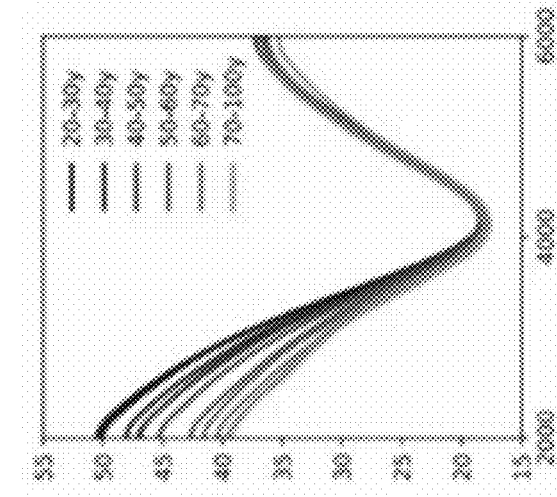

SYSTEMS AND METHODS FOR ADAPTION OF A TELEPHONIC AUDIO SIGNAL

CROSS-REFERENCE TO RELATED APPLICATIONS

This application claims priority to European Application No. 19163135.7, which was filed Mar. 15, 2019, and also claims priority to U.S. provisional application 62/719,919 which was filed Aug. 20, 2018, both of which are incorporated by reference in their entirety.

TECHNICAL FIELD

The disclosed technology relates generally to the fields of telephony, digital signal processing (DSP), audio engineering and audiology, and more specifically pertains to systems and methods for processing a telephonic audio signal to provide an augmented hearing experience for a listener.

BACKGROUND

Audio systems, including telephonic communication systems, are currently in a status quo of "one sound fits all", and do not provide an optimal sound quality to listeners. The diversity of different hearing profiles associated with the population of listeners, taken in conjunction with the increasing proportion of individuals reporting hearing issues, makes it very unlikely that a generic or default audio signal will provide an optimal sound quality and will be perceived at its full potential by all listeners, or even a majority of listeners. In light of this, the ability to have clear telephonic communication, most notably for those who have discordant hearing abilities, has become a pressing problem. Audio signal processing for communication purposes traditionally has fallen short of solving this problem. Hearing aids, although effective for improving speech comprehension for listeners, are still incredibly expensive and inaccessible for the vast majority of hearing impaired (HI) individuals. Furthermore, the use of hearing aids has been subject to social stigmatization, despite the prevalence of hearing loss across all age groups.

The most common compensation method employed by hard of hearing listeners during telephonic communication consists of a simple increase in handset volume. Less commonly, simple equalization (EQ) handset applications have been utilized. These applications apply gain(s) to frequencies in which a listener exhibits raised thresholds (see e.g. U.S. Pat. Nos. 9,138,178, 9,468,401 9,680,438, 9,898,248). Both techniques may enable a listener to better perceive conversation, however, the listener may simultaneously or subsequently experience loudness discomfort. This is because hearing impaired (HI) listeners have similar, or even reduced, discomfort thresholds when compared to normal hearing listeners, despite the hearing thresholds of such HI listeners being raised relative to normal hearing listeners. To this extent, the dynamic range of HI listeners is narrower and simply adding EQ or wide spectrum gain would be detrimental to the long-term hearing health of these HI listeners. Native applications do exist on handset devices that feature more advanced multiband compression techniques (see e.g. U.S. Pat. No. 6,944,474), however these are immensely underutilized as they require time intensive hearing tests and fitting. Moreover, hearing loss is widely undiagnosed—so adoption of these applications on a listener's device is relatively rare.

Accordingly, it would be desirable to provide more frictionless and effective telephonic processing methods that create seamless sound personalization and added clarity for HI listeners, as well as for listeners with mild to moderate hearing loss.

SUMMARY

By creating more convenient and effective telephonic processing methods that enable seamless sound personalization for hard of hearing listeners, the presented technology addresses many of the issues of cost, inconvenience and/or stigmatization posed by conventional approaches. To this extent, aspects of the present disclosure provide for an enhanced hearing experience for a HI telephonic listener through sound personalization of a telephonic call or communication.

In general, the technology features systems and methods for adaption of a telephonic audio signal. In particular, the methods may be methods of sound personalization to provide an improved listening experience for a listener on a telephonic device.

According to an aspect of the present disclosure, a method of adaption of a telephonic audio signal includes receiving a telephonic listener's (receiver) demographic information. Based on the demographic information, a set of preset parameters is retrieved from a database, whereby the preset parameters are calculated using suprathreshold hearing data representative of the demographic information. Optionally, threshold hearing data may also be used. The preset parameters are then outputted to a sound personalization digital signal processing (DSP) algorithm to configure the DSP algorithm based on the preset parameters. The voice signal is then processed using the sound personalization DSP and outputted to a transducer (e.g. loudspeaker) for presentation to the listener.

The adaption of a telephonic audio signal may occur on any combination of the following: the call sender's telephonic device, the telephonic receiver's device, and/or on a server.

According to an aspect of the present disclosure, a method of sound personalization may include receiving one or more listeners' information.

The demographic information may be received from a hard drive of a consumer device, such as from a contact list. In another embodiment, the listener's demographic information may be attained from a network server (e.g. wirelessly), such as from one or more online or social media profiles associated with the listener and/or the listener's demographic information can be obtained through a voice recognition algorithm that can ascertain the listener's identity, age and/or sex. In one embodiment, the listener's demographic information may be obtained by facial recognition, for example the listener may be recognized based on a camera-based face scan. The listener's age and/or sex may also be derived from his or her face physiology, which advantageously can eliminate the need for direct or active listener interaction/input by the listener for which demographic information is being obtained.

In one embodiment, a given listener's demographic information may be inputted manually by the one or more listeners (which may be the same or different from the given listener). Advantageously, such an embodiment permits demographic information to be obtained or otherwise received without requiring the use of a smartphone or other consumer device or profile, etc.

In one embodiment, the demographic information comprises the sex and age of one or more listeners.

In one embodiment, the demographic information comprises the sex and birthdate of the listener or group of listeners.

In one embodiment, the demographic information comprises the decade of birth of the listener or group of listeners.

In one embodiment, the demographic information comprises musical preferences of the listener.

In one embodiment, the demographic information comprises geographic information of the listener or group of listeners. For example, such geographic information may comprise a city, region, country, or any other information relating to a geographic position of the listener or group of listeners.

In one embodiment, the demographic information is manually inputted.

In one embodiment, the demographic information is retrieved from the receiver's social media account.

In one embodiment, the demographic information is retrieved from the listener's personal account supporting video, photo, music playback, video recording functionality.

In one embodiment, the demographic information is retrieved from the listener's mobile hard drive or a network server.

In one embodiment, the demographic information is ascertained using a voice recognition algorithm.

In one embodiment, the demographic information is ascertained using a facial recognition algorithm, for example by the means of a camera-based face-scan.

In one embodiment, the demographic information is derived from the identification of physiological traits of the listener. These physiological traits may include, but are not limited to, heart rate, pulse rate, tremoring of body parts such as the hands.

In one embodiment, a sound preset may be adapted to the time of the day.

According to an aspect of the present disclosure, representative suprathreshold hearing data are attained from the ascertained demographic information and used to calculate parameters for a sound personalization digital signal processing algorithm.

In another embodiment, representative suprathreshold and threshold hearing data are used to calculate parameters for a sound personalization digital signal processing algorithm In one embodiment, the representative threshold hearing data is an audiogram.

In one embodiment, the representative suprathreshold hearing data are psychophysical tuning curves (PTC).

In one embodiment, the representative suprathreshold hearing data are masked threshold (MT) curves.

In one embodiment, the parameters calculated from the representative threshold and suprathreshold hearing data of a particular demographic group are stored as a preset.

In a further embodiment, a collection of presets from particular demographic groups may be stored on a telephonic device or on a central server, or both. For instance, demographic presets from ages 20 to 90 of both men and women are stored on a central database, such that as when the age and sex of an intended listener are ascertained, the relevant preset is output to the sound personalization DSP.

In another embodiment, if a preset from a particular demographic group is not present in a database, preset values may be interpolated from the nearest available presets. For instance, presets for a male aged 58 may be interpolated from presets of a model 55 year old male and a model 60 year old male.

In one embodiment, the sound personalization DSP is based on a multiband compressive DSP algorithm. Calculated parameter presets may be used for personalizing the DSP algorithm, e.g. by setting the parameters of the multiband compressive DSP algorithm.

In one embodiment, one or more parameters of the multiband compressor system comprise the threshold value of a dynamic range compressor provided in each sub-band, the ratio value of a dynamic range compressor provided in each sub-band, and the gain value provided in each sub-band.

Unless otherwise defined, all technical terms used herein have the same meaning as commonly understood by one of ordinary skill in the art to which this technology belongs.

The term "telephonic device", as used herein, is defined as any device that enables two or more listeners to conduct voice communication and includes, but is not limited to: mobile devices such as smartphones, tablet devices, smart speakers, conference phone systems, landline telephones and/or two-way receiver systems.

The term "sound personalization", as used herein, is defined as any digital signal processing (DSP) algorithm that processes an audio signal to enhance the clarity of the signal to a listener. The DSP algorithm, for example, may comprise a multiband compressive system and/or employ equalization techniques parameterized according to the parameter preset.

The phrase "demographic information", as used herein, is defined as the characteristics of an individual, such as age, sex and ethnicity, which bear informational value for statistical purposes, such as, for example, hearing ability.

The term "listener", as used herein, is defined as one listening on a telephonic device.

BRIEF DESCRIPTION OF THE DRAWINGS

In order to describe the manner in which the above-recited and other advantages and features of the disclosure can be obtained, a more particular description of the principles briefly described above will be rendered by reference to specific embodiments thereof, which are illustrated in the appended drawings. Understand that these drawings depict only exemplary embodiments of the disclosure and are not therefore to be considered to be limiting of its scope, the principles herein are described and explained with additional specificity and detail through the use of the accompanying drawings in which:

FIG. 2 illustrates age trends extracted from PTC and MT data sets;

DETAILED DESCRIPTION

Figure 1:
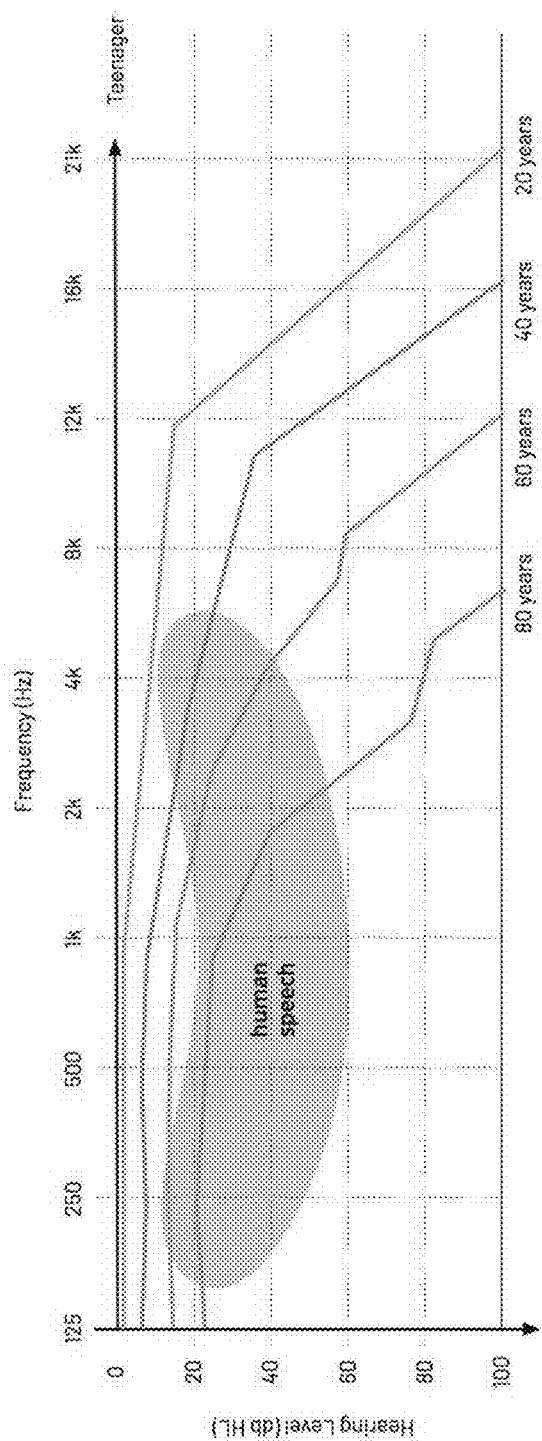
FIG. 1 illustrates the deterioration of human hearing thresholds with age.

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure. Thus, the following description and drawings are illustrative and are not to be construed as limiting the scope of the embodiments described herein. Numerous specific details are described to provide a thorough understanding of the disclosure. However, in certain instances, well-known or conventional details are not described in order to avoid obscuring the description. References to one or an embodiment in the present disclosure can be references to the same embodiment or any embodiment; and, such references mean at least one of the embodiments.

Reference to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others.

The terms used in this specification generally have their ordinary meanings in the art, within the context of the disclosure, and in the specific context where each term is used. Alternative language and synonyms may be used for any one or more of the terms discussed herein, and no special significance should be placed upon whether or not a term is elaborated or discussed herein. In some cases, synonyms for certain terms are provided. A recital of one or more synonyms does not exclude the use of other synonyms. The use of examples anywhere in this specification including examples of any terms discussed herein is illustrative only, and is not intended to further limit the scope and meaning of the disclosure or of any example term. Likewise, the disclosure is not limited to various embodiments given in this specification.

Without intent to limit the scope of the disclosure, examples of instruments, apparatus, methods and their related results according to the embodiments of the present disclosure are given below. Note that titles or subtitles may be used in the examples for convenience of a reader, which in no way should limit the scope of the disclosure. Unless otherwise defined, technical and scientific terms used herein have the meaning as commonly understood by one of ordinary skill in the art to which this disclosure pertains. In the case of conflict, the present document, including definitions will control.

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

Various example embodiments of the disclosure are discussed in detail below. While specific implementations are discussed, it should be understood that this is done for illustration purposes only. A person skilled in the relevant art will recognize that other components and configurations may be used without departing from the spirit and scope of the present disclosure.

Overview

Disclosed herein are systems and methods for adaption of a telephonic signal based on the ascertained demographic information of a listener or listeners of a telephonic signal, in order to thereby provide more frictionless and effective telephonic processing methods that create seamless sound personalization and added clarity for hearing impaired (HI) listeners, as well as listeners with mild to moderate hearing loss. In an aspect of the disclosure, a listener's approximate hearing ability is ascertained from demographic information such as age and sex, and this approximate hearing ability is then utilized as a basis for parameterizing a DSP.

Example Embodiments

FIG. 1 illustrates the typical deterioration of a listener's hearing ability over time. Past the age of 20 years old, humans begin to lose their ability to hear higher frequencies (albeit above the spectrum of human voice). This steadily becomes worse with age as noticeable declines within the speech frequency spectrum are apparent around the age of 50 or 60. However, these pure tone audiometry findings mask a more complex problem as the human ability to understand speech may decline much earlier. Although hearing loss typically begins at higher frequencies, listeners who are aware that they have hearing loss do not typically complain about the absence of high frequency sounds.

Instead, they report difficulties listening in a noisy environment and in hearing out the details in a complex mixture of sounds, such as in a telephone call. In essence, off-frequency sounds more readily mask a frequency of interest for hearing impaired individuals—conversation that was once clear and rich in detail becomes muddled. As hearing deteriorates, the signal-conditioning capabilities of the ear begin to break down, and thus hearing impaired listeners need to expend more mental effort to make sense of sounds of interest in complex acoustic scenes (or miss the information entirely). A raised threshold in an audiogram is not merely a reduction in aural sensitivity, but a result of the malfunction of some deeper processes within the auditory system that have implications beyond the detection of faint sounds. To this extent, the issue of speech clarity within telephonic communication is quite widespread.

FIG. 2 illustrates key, discernable age trends in suprathreshold hearing tests. The psychophysical tuning curve (PTC) test is a suprathreshold test that measures an individual's ability to discern a probe tone (or pulsed signal tone) against a sweeping masker noise of variable frequency and amplitude. For example, the psychophysical tuning curve test may be measured for signal tones between frequencies of 500 Hz and 4 kHz, and at a sound level of between 20 dB SL and 40 dB SL, in the presence of a masking signal for the signal tone that sweeps from 50% of the signal tone frequency to 150% of the signal tone frequency. Through the collection of large datasets, key age trends 201 can be ascertained, allowing for the accurate parameterization of personalization DSP algorithms. In a multiband compressive system, for example, the threshold and ratio values of each sub-band signal dynamic range compressor (DRC) can be modified to reduce problematic areas of frequency masking, while post-compression sub-band signal gain can be further applied in the relevant areas. Masked threshold curves 202 represent a similar paradigm for measuring masked threshold. A narrow band of noise, in this instance 202 around 4 kHz, is fixed while a probe tone sweeps from 50% of the noise band center frequency to 150% of the noise band center frequency. Again, key age trends can be ascertained from the collection of large MT datasets.

Figure 3:
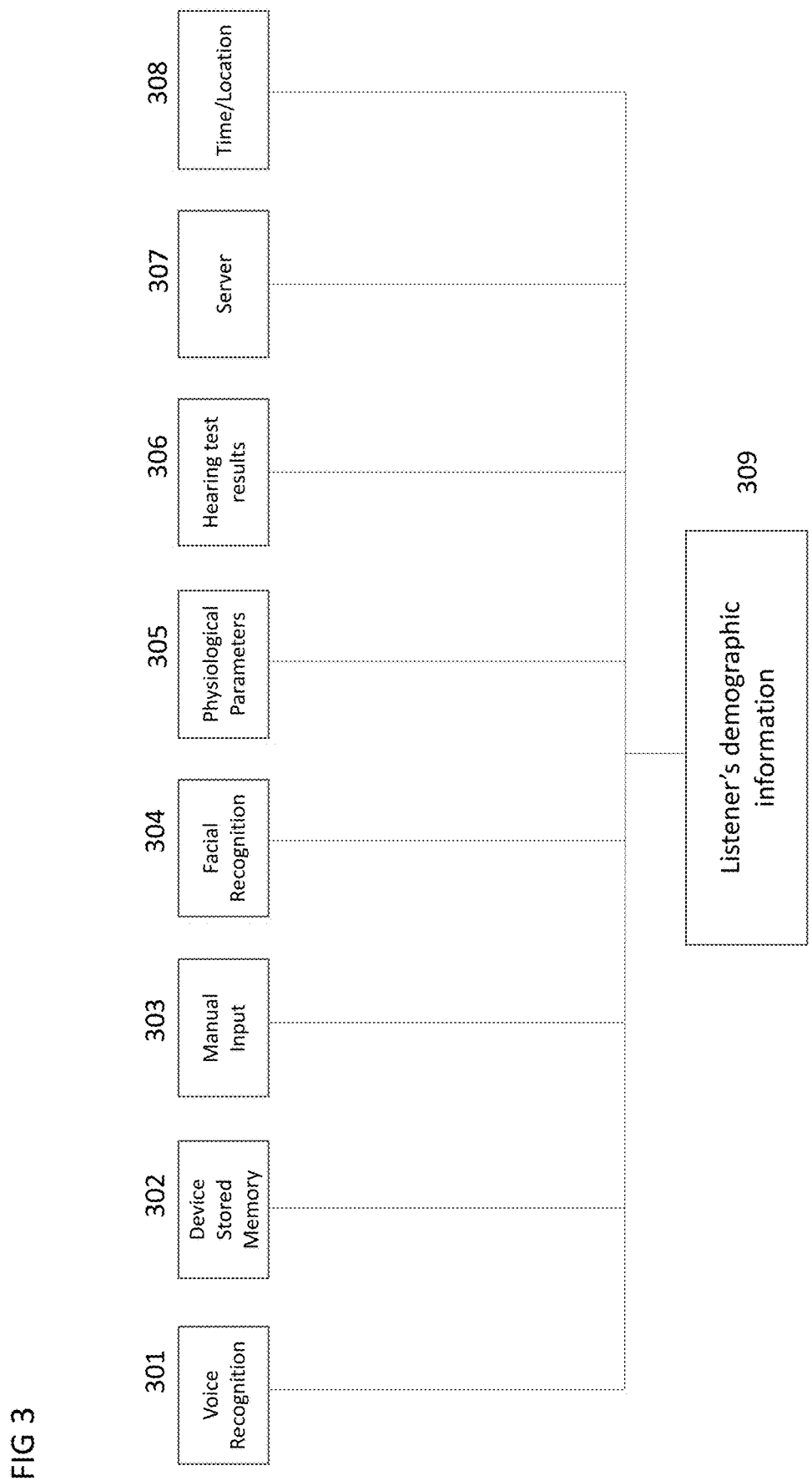
FIG. 3 illustrate exemplary data sources for ascertaining listener demographics.

FIG. 3 depict various input sources from which a listener's demographic information may be attained. Demographic information can include, but is not limited to: age, sex, country of residence, country of birth, etc. Although described separately, it is appreciated that one or more of these input sources can be utilized in combination, either separately or in cooperation, without departing from the scope of the present disclosure. In one embodiment 301, age and sex demographic information of one or more listeners may be obtained by using a speech recognition algorithm to process the listener's voice. Such speech recognition algorithms can be applied in substantially real time, can be applied to a previously recorded sample of a listener speaking, or both. The identity of the listener may be ascertained from the algorithm, enabling the retrieval of age and/or sex information from a database. More particularly, age and sex of a given listener can be estimated from a combination of vocal tract length (vtl) and pitch, both of which can be extracted from vowel sounds in the listener's speech sample. For example, children will generally have short vtls and high pitch, adult males will generally have a low pitch and long vtls, and adult women will generally have fairly long vtls and higher pitch (see e.g., Metze, F., Ajmera, J., Englert, R., Bub, U., Burkhardt, F., Stegmann, J., . . . & Littel, B., *Comparison of four approaches to age and gender recognition for telephone applications,* 2007 IEEE International Conference on Acoustics, Speech and Signal Processing, ICASSP'07 Vol. 4, pp. IV-1089).

In another embodiment 302, age and sex demographic information of one or more listeners may be retrieved from a stored memory of a telephonic and/or personal computing device. For example, age data of the listener can be retrieved from a birth date associated with a contact card, contact list, calendar entry, etc., that is provided on or otherwise accessible to the telephonic device. In some embodiments 303, age and sex demographic information of an intended listener can be manually input by the call sender prior to initiating a call with the intended listener. In some embodiments 304, age and sex demographic information of an intended listener can be obtained through facial recognition technology, such as from the camera of a mobile phone. In some embodiments 305, physiological measurements may be used, such as heart rate, blood pressure and/or tremoring of the hands. In some embodiments 306, threshold and suprathreshold hearing test results may be used. In some embodiments 307, a listener or intended listener's demographic information can be obtained from a server (e.g. wireless network connection), e.g. from a social media account (Facebook, Twitter, LinkedIn, etc.) of the listener or intended listener. In some embodiments 308, time and location of a listener may be used to determine DSP parameterization, e.g. applying more gain if an individual is in a noisy location.

Figure 4:
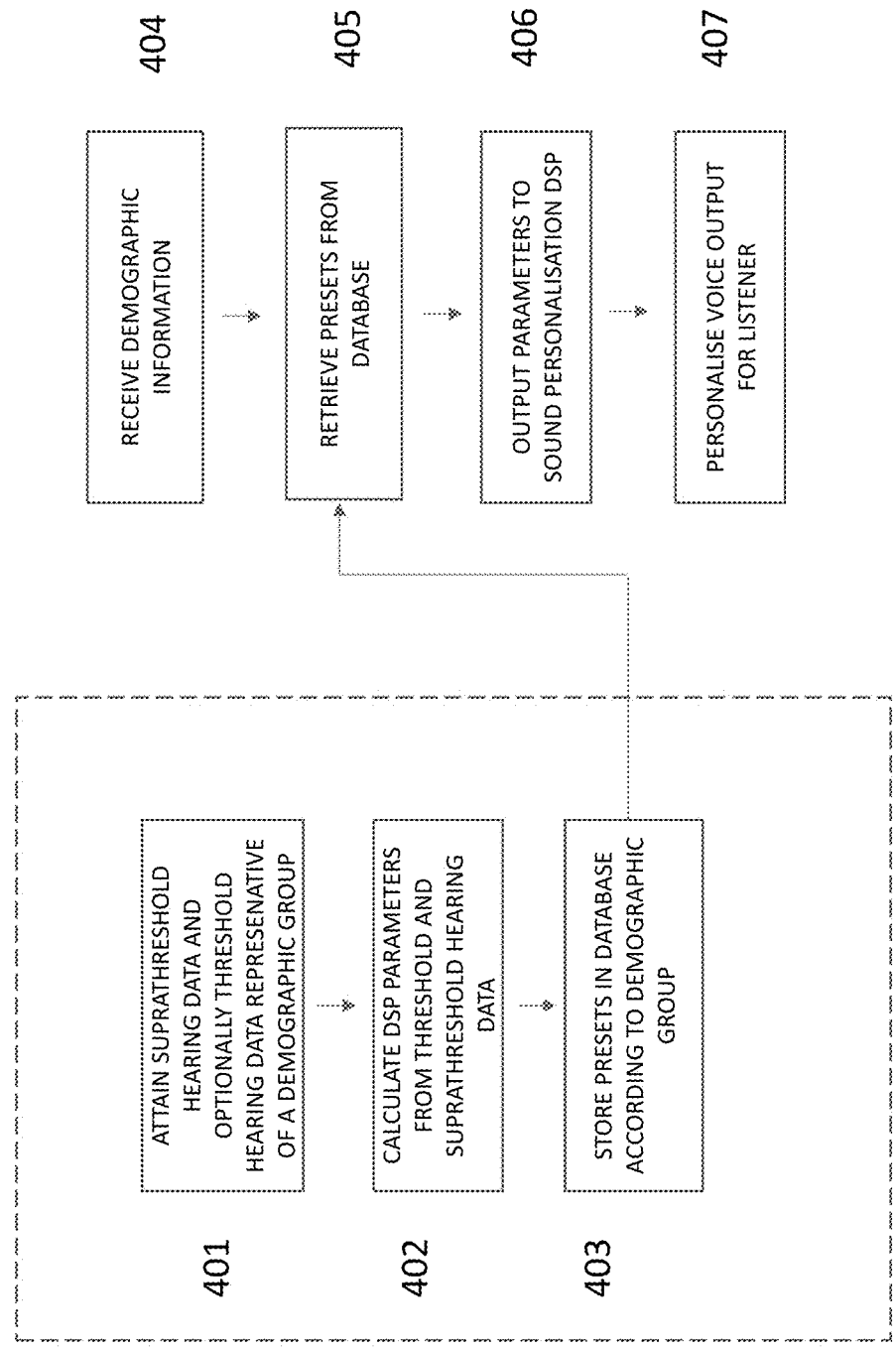
FIG. 4 illustrates an example method of adaptation of a telephonic signal according to one or more aspects of the present disclosure.

FIG. 4 illustrates an example method of telephonic personalization according to one or more aspects of the present disclosure. In a first step 401, hearing data representative of a demographic group is attained. In a preferred embodiment, this hearing data comprises threshold and suprathreshold data from a given demographic group. In another embodiment, threshold data may be derived from suprathreshold information (see commonly owned application EP17162448.9 and U.S. application Ser. No. 16/080,785). This representative data is then used to calculate DSP parameters 402. Threshold (i.e. pure tone audiometry) data may comprise audiogram profiles demographically categorized, for instance, by age and sex (see ex. FIGS. 1, 2). An audiogram is a graph that shows the audible threshold for standardized frequencies as measured by an audiometer (see ex. FIG. 1). Suprathreshold data may comprise psychophysical tuning curve (PTC) data and/or masked threshold (MT) data across a range of standardized frequencies (see ex. FIG. 2). Suprathreshold data represents a more robust source for calculating DSP parameters as it is not only a listener's ability to perceive mere faint sounds as a listener grows older, but the listener's ability to discern sounds against a backdrop of noise that markedly deteriorates with age. To this extent, using threshold and suprathreshold data provides a richer and more complex data set relative to the prior art, enabling a more accurate parameterization of a multiband dynamics processor.

DSP parameters calculated for a given demographic group are then stored on a database as a preset 403. When a telephonic call takes place, demographic information of the listener or intended listener of a call is received, retrieved, or otherwise obtained at a listener's telephonic device and/or server 404. This demographic information can include age and sex, although this is not intended to be limiting and it is noted that the demographic information can include various other parameters without departing from the scope of the present disclosure (see FIG. 3).

In a next step, the demographic information of the intended listener of the call is used to retrieve the correct parameter preset from the database 405. The retrieved parameter preset is outputted to the sound personalization DSP 406 and the voice output is processed for the listener 407.

In some embodiments, parameter presets may be adjusted based on the known hearing capabilities of the intended listener 306.

In one embodiment, ratio and threshold values for a compressor, as well as gain, in a given multiband dynamic processor signal subband may be calculated by comparing demographically-estimated threshold and suprathreshold information for a listener with that of a normal hearing individual, i.e. reference audiograms and PTC/MT curves. For instance, masking contour curve data, such as PTC or MT, may be used to calculate ratio and threshold parameters for a given frequency subband, while audiogram data may be used to calculate gain within a given frequency subband.

Figure 5:
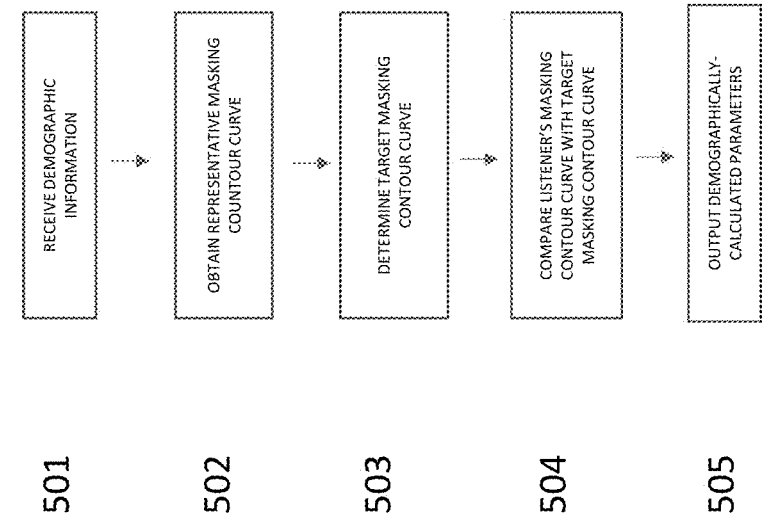
FIG. 5 illustrates method of attaining ratio and threshold parameters from a demographically-estimated masking contour curve.
Figure 6:
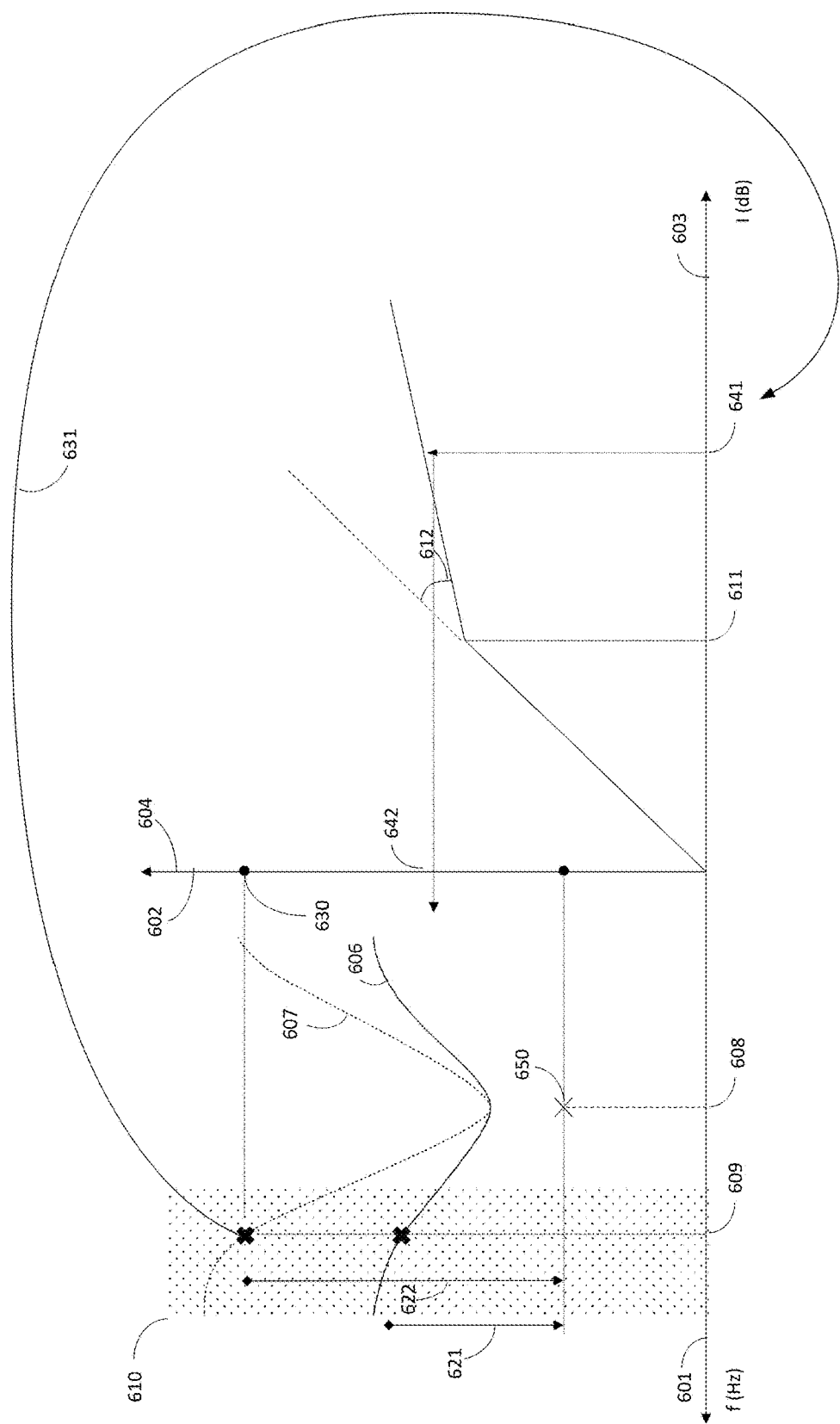
FIG. 6 illustrates a graph for attaining ratio and threshold parameters from a demographically-estimated PTC curve.

FIGS. 5, 6 gives one way of setting up the ratio and threshold parameters for a frequency band in a multi-band compression system (also see commonly owned applications EP18200368.1 and U.S. application Ser. No. 16/201, 839). Briefly, demographic information is received 501 and subsequently, a representative masking contour curve is obtained 502 based on the demographic information. A target masking curve is determined 503 and subsequently compared with the representative masking contour curve 504 in order to determine and output demographically-calculated DSP parameters 505. FIG. 6 combines the visualization of the demographically-estimated masking contour curve 606 for a listener (listener) and target masking contour curve 607 of a probe tone 650 (x-axis 601 being frequency, y-axis 602 being the sound level in dB SPL or HL) and an input/output graph of a compressor showing the input level 603 versus the output level 604 of a sound signal, in decibels relative to full scale (dB FS). The bisecting line in the input/output graph represents a 1:1 (unprocessed) output of the input signal with gain 1. Parameters of the multi-band compression system in a frequency band are threshold 611 and gain 612. These 2 parameters are determined from the demographically-estimated masking contour curve 606 for the listener and target masking contour curve 1207. The threshold 611 and ratio 612 must satisfy the condition that the signal-to-noise ratio 621 (SNR) of the demographically-estimated masking contour curve at a given frequency 609 is greater than the SNR 622 of the target masking contour curve at the same given frequency 609. The SNR is herein defined as the level of the signal tone compared to the level of the masker noise. The broader the curve will be, the greater the SNR. The given frequency 609 may be arbitrarily chosen, for example beyond a minimum distance from the probe tone frequency 608.

The sound level 630 in dB of the target masking contour curve at a given frequency corresponds (see bent arrow 631 in FIG. 12) to an input sound level 641 entering the compression system. The objective is that the sound level 642 outputted by the compression system will match the demographically-estimated masking contour curve 606, i.e., that his sound level 642 is substantially equal to the sound level in db of the demographically-estimated masking contour curve at the given frequency 609. This condition allows to derive the threshold 611 (which has to be below the input sound level, if not, there is no change as below the threshold of the compressor, the system is linear) and the ratio 612. In other words, input sound level 641 and output sound level 642 determine a reference point of the compression curve. Threshold 611 must be selected to be lower than input sound level 641. Once the threshold is selected, the ratio 612 can be determined from the threshold and the reference point.

In the context of the present invention, a masking contour curve is constructed from demographic information, such as age and sex. A target masking contour curve 607 is interpolated from at least the demographically-estimated masking contour curve and a reference masking contour curve, representing the curve of a normal hearing individual. The target curve is preferred over of a reference curve because fitting an audio signal to a reference curve is not necessarily optimal. Depending on the initial hearing ability of the listener, fitting the processing according to a reference curve may cause an excess of processing to spoil the quality of the signal. The objective is to process the signal in order to obtain a good balance between an objective benefit and a good sound quality.

The given frequency 609 is then chosen. It may be chosen arbitrarily, at a certain distance from the tone frequency 608. The corresponding sound levels of the listener and target masking contour curves are determined at this given frequency 609. The value of these sound levels may be determined graphically on the y-axis 602.

The right panel in FIG. 6 (see the contiguous graph) illustrates a broken stick DRC (or bent knee DRC), with a threshold 611 and a ratio 612 as parameters that need to be determined. An input sound signal having a sound level 630/641 at a given frequency 609 enters the compression system. The sound signal should be processed by the DRC in such a way that the outputted sound level is the sound level of the demographically-estimated masking contour curve 606 at the given frequency 609. The threshold 611 should not exceed the input sound level 641, otherwise compression will not occur. Multiple sets of threshold and ratio parameters are possible. Preferred sets can be selected depending on a fitting algorithm and/or objective fitting data that have proven to show the most benefit in terms of sound quality. For example, either one of the threshold 611 and ratio 612 may be chosen to have a default value, and the respective other one of the parameters can then be determined by imposing the above-described condition.

For calculating gain within a subband signal, the results of a demographically-estimated audiogram may be used. For instance, raised thresholds may be compensated for by a corresponding frequency gain.

Figure 7:
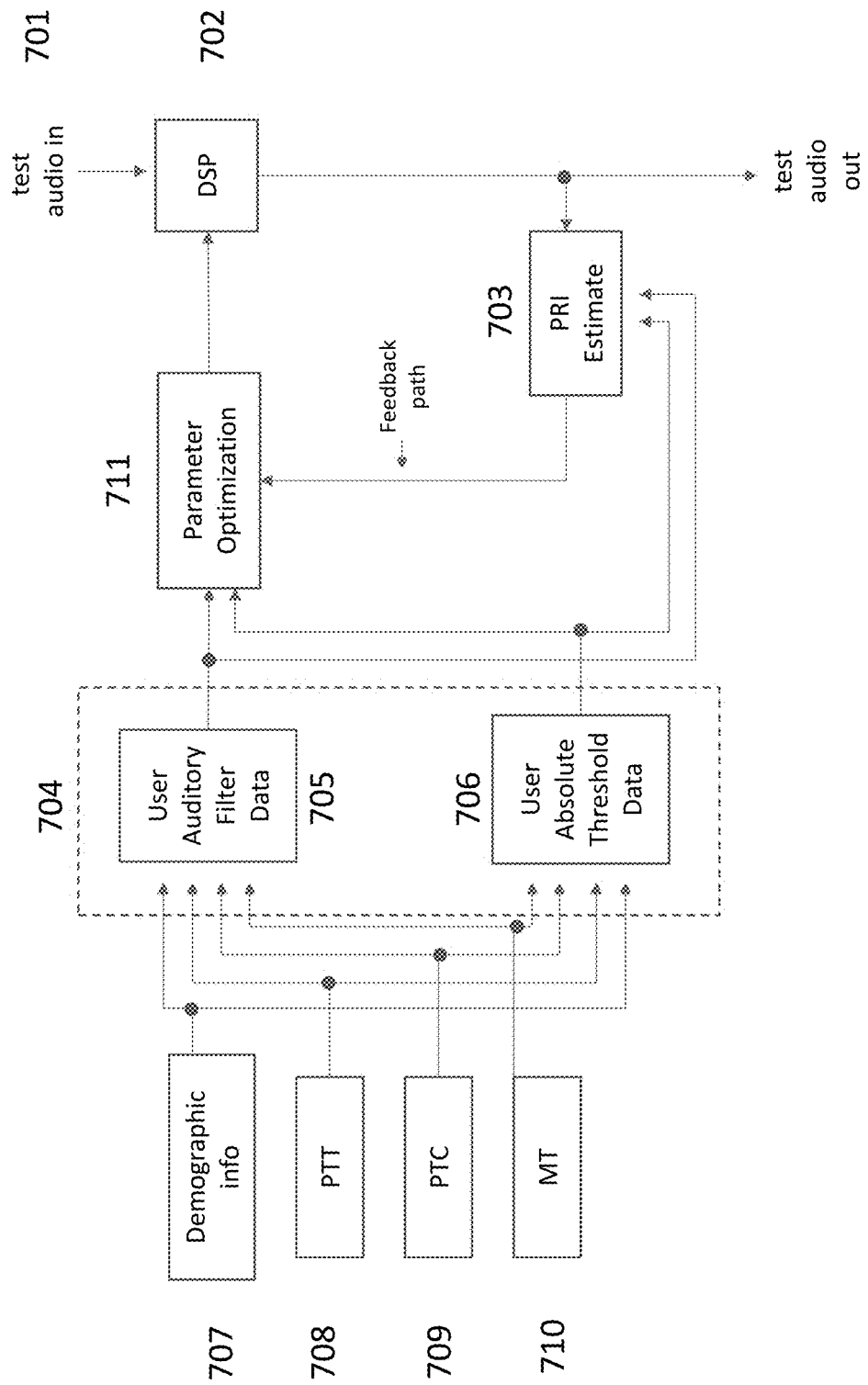
FIG. 7 illustrates a method for attaining DSP parameters from demographic data through the optimization of perceptually relevant information.

In another embodiment as shown in FIG. 7, DSP parameters in a multiband dynamic processor may be calculated by optimizing perceptual relevant information (e.g. perceptual entropy) through parameterization using demographically-estimated threshold and suprathreshold information (see commonly owned U.S. application Ser. No. 16/206,376 and EP18208020.0). Briefly, in order to optimally parameterize a multiband dynamic processor through perceptually relevant information, an audio sample 701, or body of audio samples, is first processed by a parameterized multiband dynamics processor 702 and the perceptual entropy of the file is calculated 703 according to demographically-estimate threshold and suprathreshold information 707. After calculation, the multiband dynamic processor is re-parameterized 711 according to a given set of parameter heuristics, derived from optimization, and from this—the audio sample(s) is reprocessed 702 and the PRI calculated 703. In other words, the multiband dynamics processor is configured to process the audio sample so that it has a higher PRI value for the particular listener, taking into account the individual listener's demographically-estimated threshold and suprathreshold information 707. To this end, parameterization of the multiband dynamics processor is adapted to increase the PRI of the processed audio sample over the unprocessed audio sample. The parameters of the multiband dynamics processor are determined by an optimization process that uses PRI as its optimization criteria.

PRI can be calculated according to a variety of methods found in the prior art. One such method, also called perceptual entropy, was developed by James D. Johnston at Bell Labs, generally comprising: transforming a sampled window of audio signal into the frequency domain, obtaining masking thresholds using psychoacoustic rules by performing critical band analysis, determining noise-like or tone-like regions of the audio signal, applying thresholding rules for the signal and then accounting for absolute hearing thresholds. Following this, the number of bits required to quantize the spectrum without introducing perceptible quantization error is determined. For instance, Painter & Spanias disclose a formulation for perceptual entropy in units of bits/s, which is closely related to ISO/IEC MPEG-1 psychoacoustic model 2 [Painter & Spanias, Perceptual Coding of Digital Audio, Proc. Of IEEE, Vol. 88, No. 4 (2000); see also generally Moving Picture Expert Group standards https://mpeg.chiariglione.org/standards; both documents included by reference].

Various optimization methods are possible to maximize the PRI of audio samples, depending on the type of the applied audio processing function such as the above mentioned multiband dynamics processor. For example, a subband dynamic compressor may be parameterized by compression threshold, attack time, gain and compression ratio for each subband, and these parameters may be determined by the optimization process. In some cases, the effect of the multiband dynamics processor on the audio signal is non-linear and an appropriate optimization technique such as gradient descend is required. The number of parameters that need to be determined may become large, e.g. if the audio signal is processed in many subbands and a plurality of parameters needs to be determined for each subband. In such cases, it may not be practicable to optimize all parameters simultaneously and a sequential approach for parameter optimization may be applied. Although sequential optimization procedures do not necessarily result in the optimum parameters, the obtained parameter values result in increased PRI over the unprocessed audio sample, thereby improving the listener's listening experience.

Other parameterization processes commonly known in the art may be used to calculate parameters based off demographically-estimated threshold and suprathreshold information. For instance, common prescription techniques for linear DSP may be employed. Well known procedures for linear hearing aid algorithms include POGO, NAL, and DSL. See, e.g., H. Dillon, Hearing Aids, $2^{nd}$ Edition, Boomerang Press, 2012.

Fine tuning of any of the above mentioned techniques may be estimated from manual fitting data. For instance, it is common in the art to fit a multiband dynamic processor according to series of tests given to a patient in which parameters are adjusted according to a patient's responses, e.g. a series of A/B tests in which the patient is asked which set of parameters subjectively sounds better. This testing ultimately guides the optimal parameterization of the DSP. In this instance, manually-fit results of a given DSP can be demographically categorized and averaged and/or interpolated to provide an optimal demographic-based parameter setting by age group, sex, etc.

In a next step, the calculated hearing parameters are outputted to a sound personalization DSP, for personalized configuration of the signal processing algorithm based on the set of parameters.

In a next step, the sound personalization DSP then personalizes a voice signal in substantially real-time. In particular, the sound personalization DSP is provided as an intermediate component in the presently disclosed audio processing pipeline.

Figure 8:
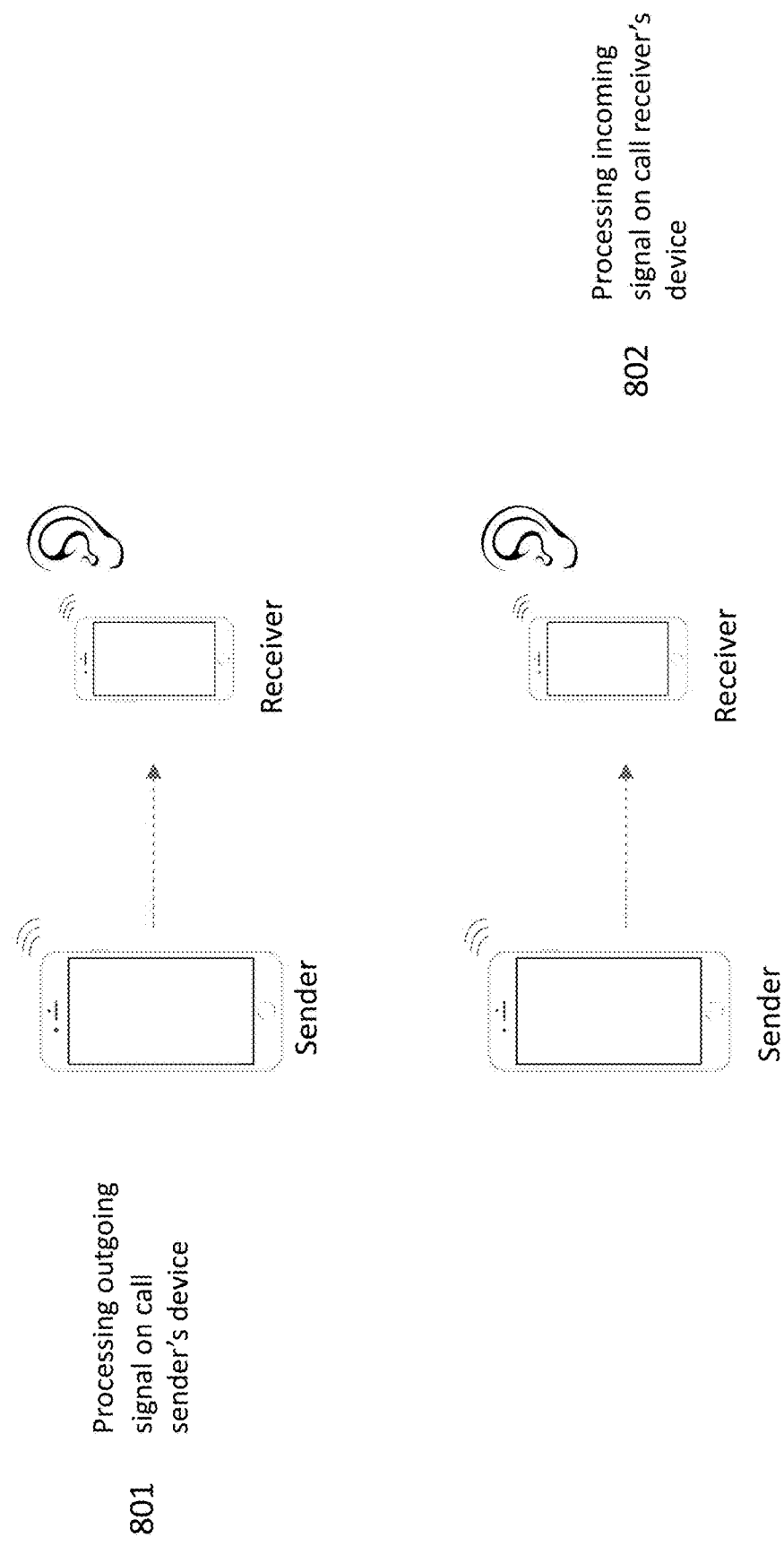
FIG. 8 illustrates an example method of adaptation of a telephonic signal in which an outgoing telephonic signal 801 on a sender's device is processed and sent to receiver. In another example, the incoming telephonic signal is processed on the receiver's device 802.

FIG. 8 depicts two embodiments in which the telephonic signal may be processed. The outgoing signal may be processed on the call sender's device 801 or the incoming signal may be processed on the call receiver's device 802.

Figure 9:
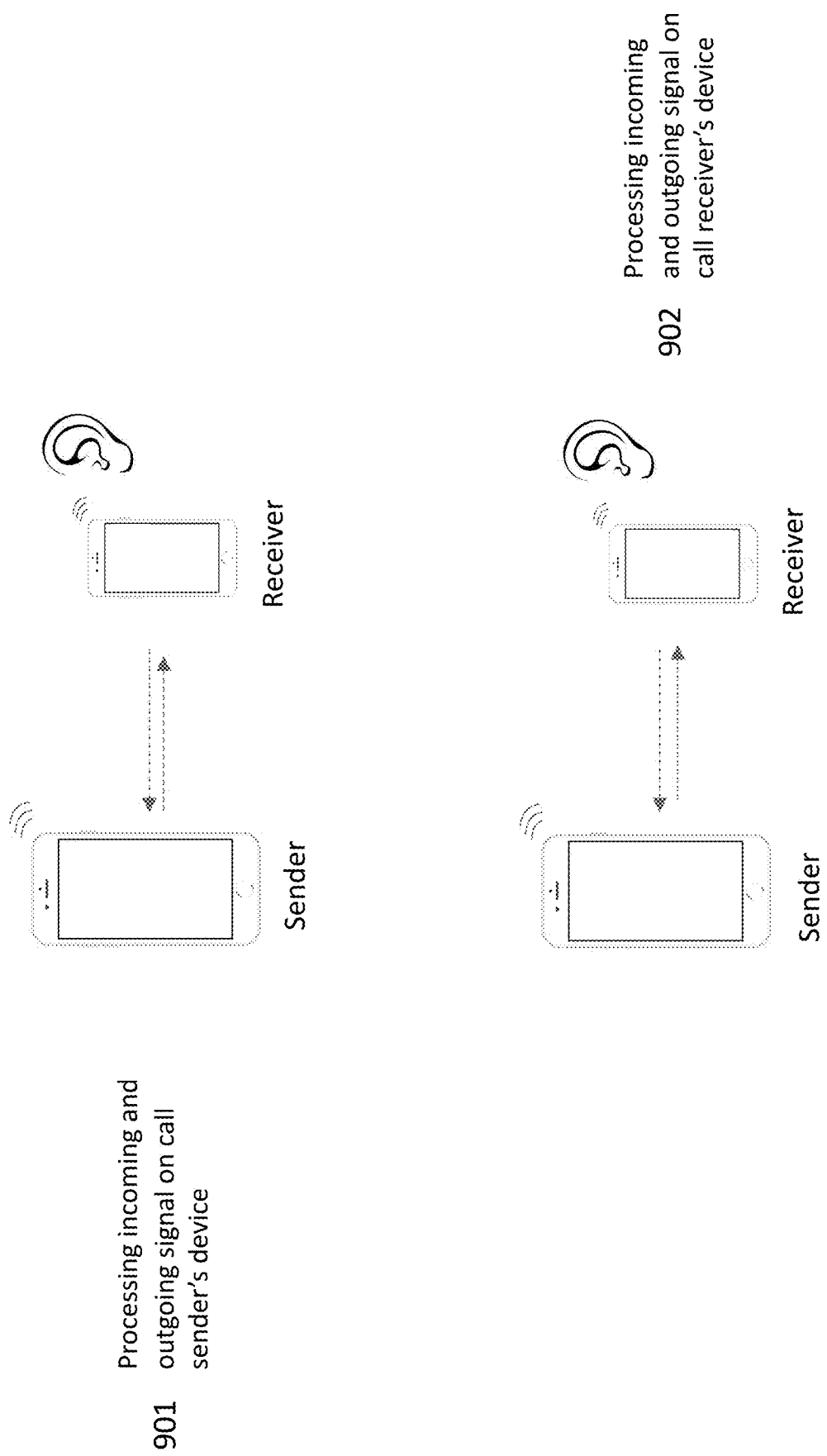
FIG. 9 illustrates a variant of the method of FIG. 8 in which an incoming and outgoing telephonic signal is processed entirely on either the call sender's or receiver's device.

FIG. 9 depicts two additional embodiments in which the telephonic signal may be processed. Both the incoming and outgoing signals may be both be processed on the sender device 901 or on the receiver device 902. This would be useful, for example, if both the call sender and receiver are hard of hearing.

Figure 10:
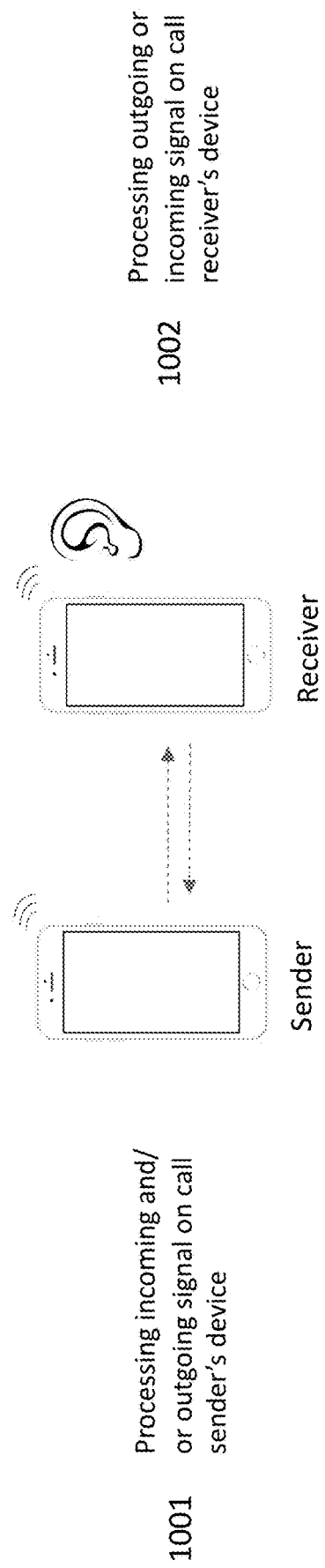
FIG. 10 illustrates a variant of the method of FIG. 9. in which an incoming and outgoing telephonic signal is processed on the sender's device and receiver's device, respectively. The arrangement may be optionally reversed.

FIG. 10 depicts a variation of FIG. 9, in which the incoming and outgoing telephonic signal are processed on the call sender and call receiver device 1001, respectively (or optionally vice-versa 1002).

Figure 11:
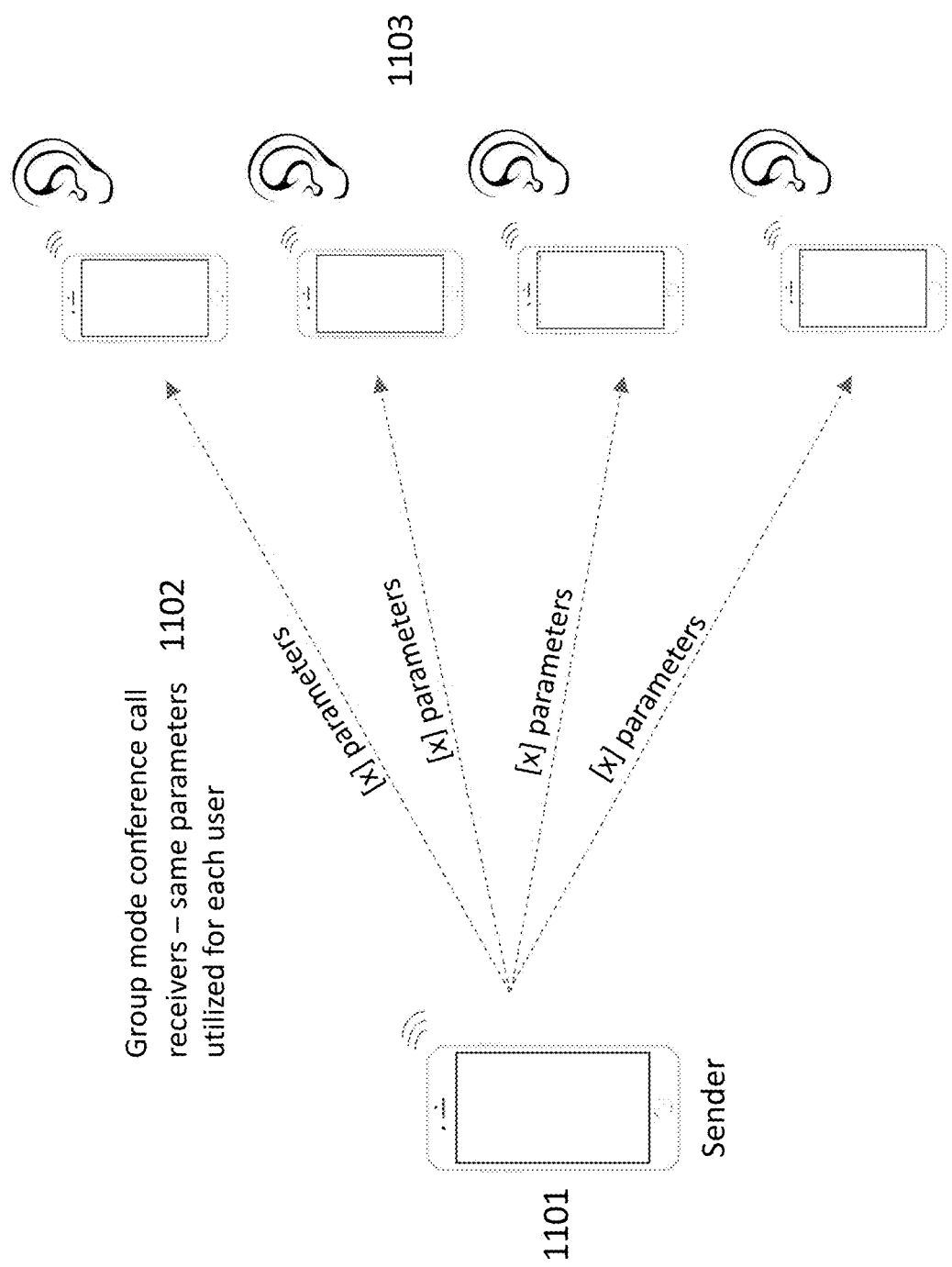
FIG. 11 illustrates an example method of group adaptation of a telephonic signal in which the general demographic characteristics of a group are determined (e.g. average age) and one set of DSP parameters associated with the group is used to process the telephonic signal.

FIG. 11 depicts another embodiment, in which there is a conference call. Here, a group mode would process the telephonic signal using the same parameters for each individual 1102. Parameters may be determined, for example, by averaging the demographic information of everyone 1103, or by using a weighted scale.

Figure 12:
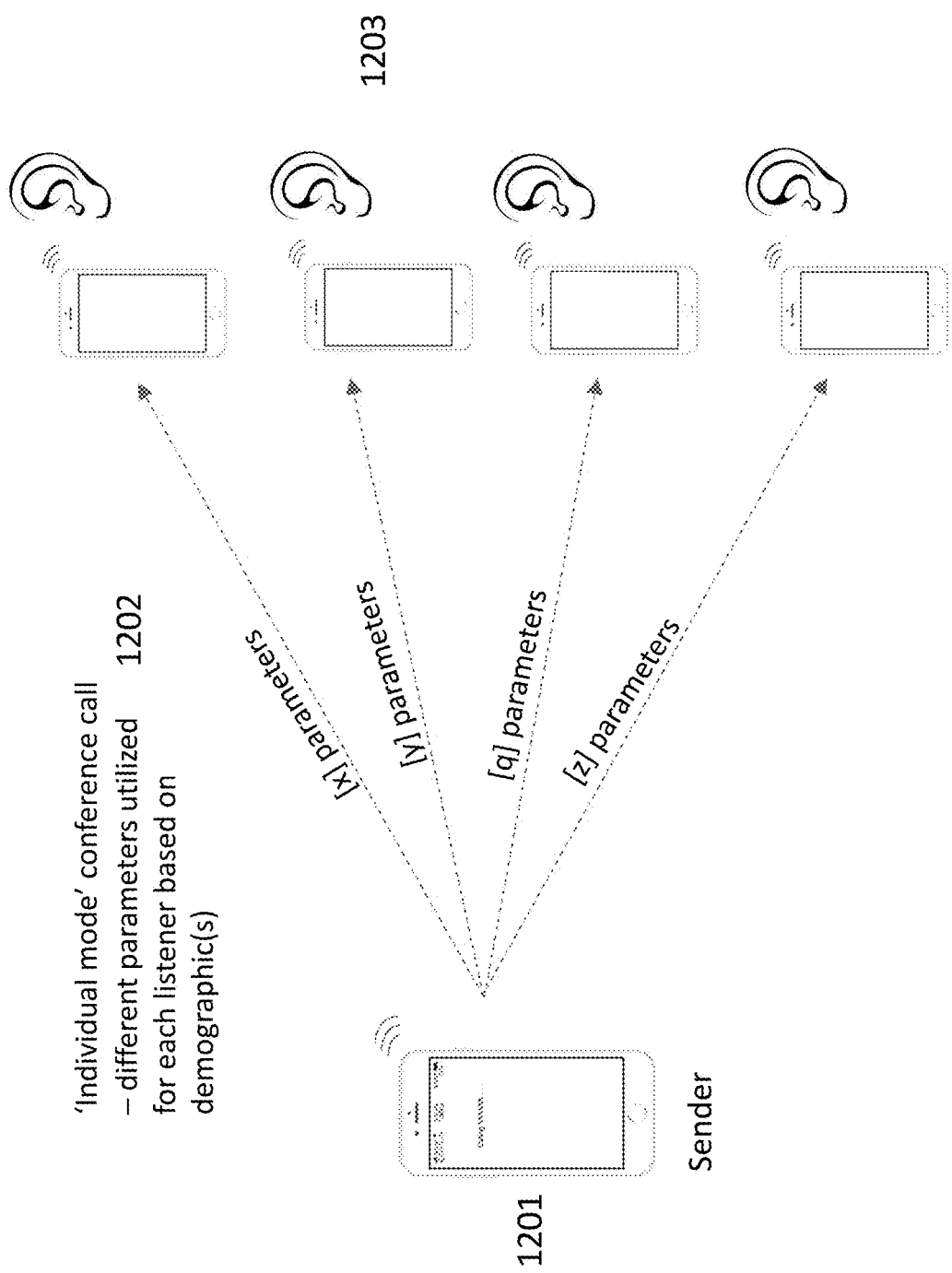
FIG. 12 illustrates a variant of FIG. 11, in which DSP parameters are specific for each individual caller within a group.

FIG. 12 depicts a variation of FIG. 11, in which the telephonic signal is processed differently for each listener 1202, 1203 according to their individual demographic information.

Figure 13:
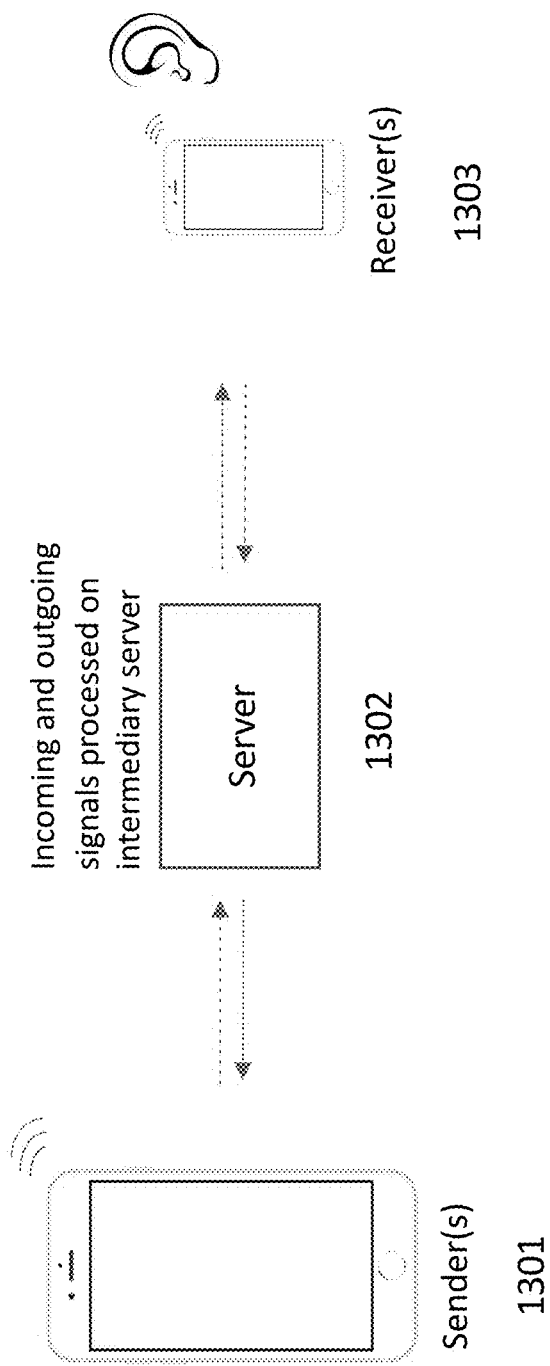
FIG. 13 illustrates an example method of adaptation of a telephonic signal in which processing occurs on a server.

FIG. 13 depicts an embodiment in which incoming 1303 and/or outgoing 1301 signals are processed on an intermediary server 1302.

Figure 14:
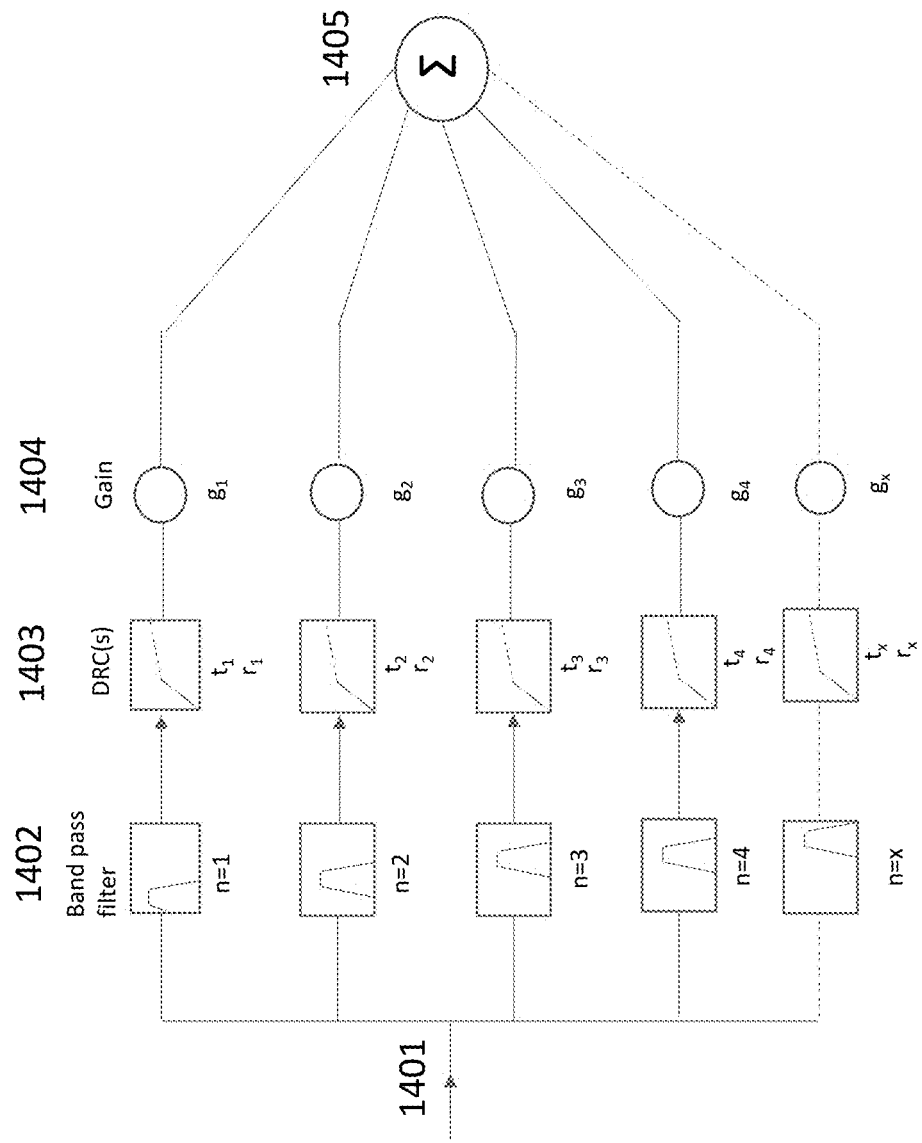
FIG. 14 illustrates an example multiband compressive system according to one or more aspects of the present disclosure.

FIG. 14 depicts a multi-band compressive DSP system capable of providing the presently disclosed sender side telephonic personalization. An incoming signal 1401 (e.g. voice signal, either raw or pre-processed) is spectrally decomposed into a plurality of sub-band signals by a corresponding plurality of band pass filters 1402. Subsequently, each sub-band signal is transmitted to a dynamic range compressor (DRC) 1403. As illustrated, there is a DRC provided for each sub-band signal, although a greater or lesser number of DRCs 1403 can be provided with respect to the number of sub-band signals as desired, without departing from the scope of the present disclosure. One or more of the DRCs 1403 can be identical, similar, or different, depending on the particular sound personalization that is configured or otherwise desired. In some embodiments, for each sub-band signal, the corresponding one of the DRCs 1403 features a threshold variable $t_x$ (i.e., the threshold value at which DRC compression initiates) and a ratio variable $r_x$ (i.e, the amount of gain reduction provided by the DRC above threshold $t_x$). Subsequently, each sub-band signal may be subject to variable gain $g_x$ 1404 following compression at DRC 1403. For each sub-band signal, the variables may differ according to the receiver's demographic information.

Figure 15:
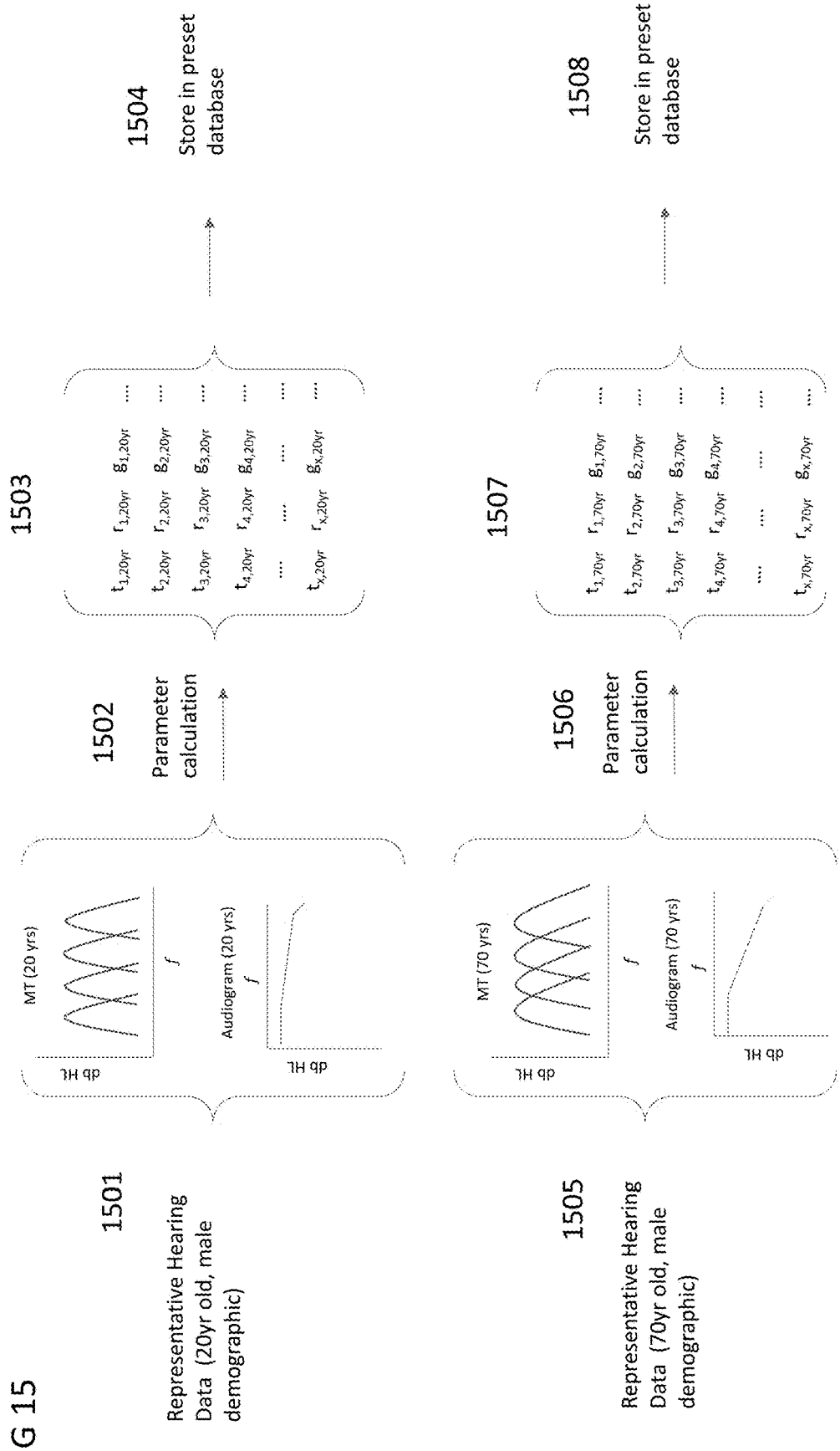
FIG. 15 illustrates how representative hearing data of a demographic group are used to calculate a parameter preset, which is then stored in a database.
Figure 16:
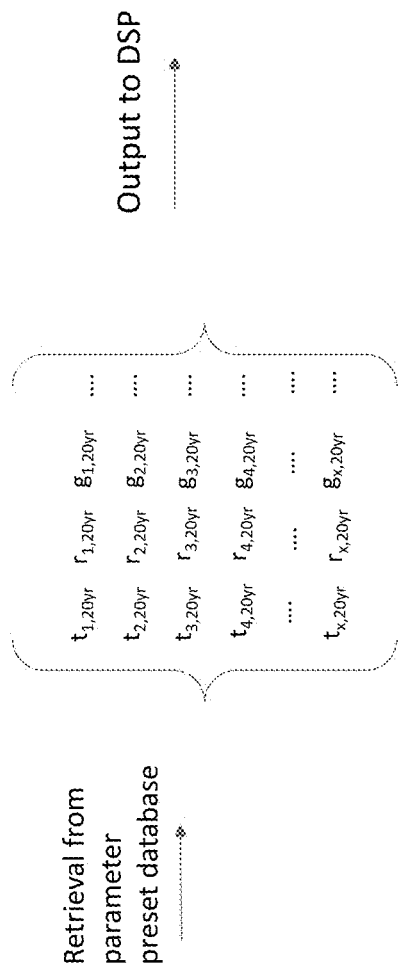
FIG. 16 illustrates how parameters are retrieved from a database based on a listener's demographic information and outputted to a sound personalization DSP.

FIGS. 15 and 16 illustrate how a set of parameters may be configured or preset according to an age of an intended listener, although it is appreciated that the exemplary parameter preset can also be applied to sex or other demographic information of the intended listener. In the particular example of FIG. 15, for an intended listener that is 20 years of age and male, hearing data 1501 comprising threshold and suprathreshold information across a range of audible frequencies is used to calculate 1502 a parameter preset 1503. This preset is then stored in a database 1504 according to the particular demographic group. In another example, a preset 1507 is calculated 1506 from the hearing data 1505 of a model 70 year old male and stored in the preset database 1508. Accordingly, these presets 1604, 1608 may then later be retrieved 1603, 1607 from the database 1504, 1508 when a listener's demographic information is ascertained 1601, 1606. As illustrated in this example, these parameter presets 1604, 1608 include $t_x$, $r_x$, and $g_x$ values for various values of x, where each individual value is parameterized by age as well, e.g., $\{t_{1,20\ yrs\ age}, r_{1,20\ yrs\ age}, g_{1,20\ yrs\ age}\}$ and $\{t_{1,70\ yrs\ age}, r_{1,70\ yrs\ age}, g_{1,70\ yrs\ age}\}$.

In some embodiments, one or more of the parameters for a given listener or a given hearing profile may be interpolated from the nearest relevant age presets, e.g. a 47-year-old hearing preset can be interpolated from existing 45 year old and 50 year old parameter presets. Other configurations of multiband compressive systems are possible without departing from the scope of the present disclosure (see e.g., commonly owned U.S. patent Ser. No. 10/199,047, U.S. application Ser. No. 16/244,727), with relevant associated parameters.

Figure 17:
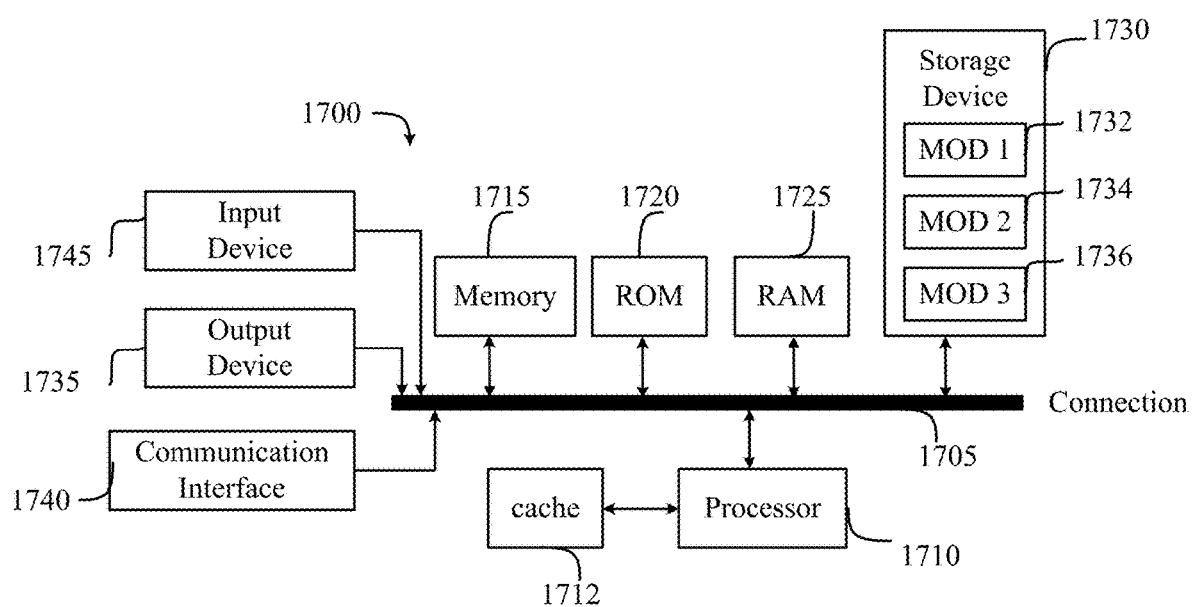
FIG. 17 illustrates an example system embodiment.

FIG. 17 shows an example of computing system 1700, which can be for example any computing device making up (e.g., mobile device 100, server, etc.) or any component thereof in which the components of the system are in communication with each other using connection 1705. Connection 1705 can be a physical connection via a bus, or a direct connection into processor 1710, such as in a chipset architecture. Connection 1705 can also be a virtual connection, networked connection, or logical connection.

In some embodiments computing system 1700 is a distributed system in which the functions described in this disclosure can be distributed within a datacenter, multiple datacenters, a peer network, etc. In some embodiments, one or more of the described system components represents many such components each performing some or all of the function for which the component is described. In some embodiments, the components can be physical or virtual devices.

Example system 1700 includes at least one processing unit (CPU or processor) 1710 and connection 1705 that couples various system components including system memory 1715, such as read only memory (ROM) 1720 and random access memory (RAM) 1725 to processor 1710. Computing system 1700 can include a cache of high-speed memory 1712 connected directly with, in close proximity to, or integrated as part of processor 1710.

Processor 1710 can include any general purpose processor and a hardware service or software service, such as services 1732, 1734, and 1736 stored in storage device 1730, configured to control processor 1710 as well as a special-purpose processor where software instructions are incorporated into the actual processor design. Processor 1710 may essentially be a completely self-contained computing system, containing multiple cores or processors, a bus, memory controller, cache, etc. A multi-core processor may be symmetric or asymmetric.

To enable user interaction, computing system 1700 includes an input device 1745, which can represent any number of input mechanisms, such as a microphone for speech, a touch-sensitive screen for gesture or graphical input, keyboard, mouse, motion input, speech, etc. Computing system 1700 can also include output device 1735, which can be one or more of a number of output mechanisms known to those of skill in the art. In some instances, multimodal systems can enable a user to provide multiple types of input/output to communicate with computing system 1700. Computing system 1700 can include communications interface 1740, which can generally govern and manage the user input and system output. There is no restriction on operating on any particular hardware arrangement and therefore the basic features here may easily be substituted for improved hardware or firmware arrangements as they are developed.

Storage device 1730 can be a non-volatile memory device and can be a hard disk or other types of computer readable media which can store data that are accessible by a computer, such as magnetic cassettes, flash memory cards, solid state memory devices, digital versatile disks, cartridges, random access memories (RAMs), read only memory (ROM), and/or some combination of these devices.

The storage device 1730 can include software services, servers, services, etc., that when the code that defines such software is executed by the processor 1710, it causes the system to perform a function. In some embodiments, a hardware service that performs a particular function can include the software component stored in a computer-readable medium in connection with the necessary hardware components, such as processor 1710, connection 1705, output device 1735, etc., to carry out the function.

The presented technology offers a novel and convenient way to provide added clarity to the telephonic communications of receivers who may suffer from known or undiagnosed hearing deficiencies by seamlessly personalizing phone calls. It is to be understood that the present disclosure contemplates numerous variations, options, and alternatives. For clarity of explanation, in some instances the present technology may be presented as including individual functional blocks including functional blocks comprising devices, device components, steps or routines in a method embodied in software, or combinations of hardware and software.

Any of the steps, operations, functions, or processes described herein may be performed or implemented by a combination of hardware and software services or services, alone or in combination with other devices. In some embodiments, a service can be software that resides in memory of a client device and/or one or more servers of a content management system and perform one or more functions when a processor executes the software associated with the service. In some embodiments, a service is a program, or a collection of programs that carry out a specific function. In some embodiments, a service can be considered a server. The memory can be a non-transitory computer-readable medium.

In some embodiments the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions may be, for example, binaries, intermediate format instructions such as assembly language, firmware, or source code. Examples of computer-readable media that may be used to store instructions, information used, and/or information created during methods according to described examples include magnetic or optical disks, solid state memory devices, flash memory, USB devices provided with non-volatile memory, networked storage devices, and so on.

Devices implementing methods according to these disclosures can comprise hardware, firmware and/or software, and can take any of a variety of form factors. Typical examples of such form factors include servers, laptops, smart phones, small form factor personal computers, personal digital assistants, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

The invention claimed is:

1. A method, comprising:
   receiving, at a processor, demographic information of a listener;
   retrieving, via the processor, a set of preset parameters from a database based on the demographic information, wherein:
     the set of preset parameters is calculated using representative suprathreshold hearing data that corresponds to the demographic information of the listener; and
     the representative suprathreshold hearing data is generated from one or more suprathreshold hearing tests that measure an ability of a given test subject to discern one or more probe tones that are greater than the given test subject's auditory thresholds, where each given test subject shares the demographic information of the listener;
   processing, via the processor, a voice signal using a sound personalization digital signal processing algorithm; and
   outputting, via the processor, the processed voice signal to a transducer.

2. The method of claim 1, wherein the demographic information comprises sex and age of the listener.

3. The method of claim 1, wherein the demographic information of the listener comprises sex and birthdate of the listener.

4. The method of claim 1, wherein the demographic information is manually inputted.

5. The method of claim 1, wherein the demographic information is retrieved from a social media account associated with the listener.

6. The method of claim 1, wherein the demographic information is retrieved on a telephonic device associated with the listener.

7. The method of claim 1, wherein the demographic information is ascertained using voice recognition.

8. The method of claim 1, wherein the sound personalization digital signal processing algorithm is a multiband dynamics processor.

9. The method of claim 8, wherein parameters of the multiband dynamics processor comprise at least one of a threshold value of a dynamic range compressor provided in each subband, a ratio value of a dynamic range compressor provided in each sub-band, and a gain value provided in each sub-band.

10. The method of claim 1, wherein the transducer is on a mobile device.

11. The method of claim 1, wherein the parameter presets are calculated using a threshold and a suprathreshold hearing data representative of the demographic information.

12. The method of claim 1, wherein the preset parameters are calculated by optimizing perceptually relevant information based on suprathreshold hearing data representative of the listener's demographic group.

13. The method of claim 1, wherein the processing of a voice signal is carried out on any one of a telephonic device of a call sender, a telephonic device of a call receiver, or a server.

14. The method of claim 1, wherein the set of preset parameters are stored on anyone of a telephonic device or server.

15. A telephonic device configured to:
   receive demographic information of a listener;
   retrieve a set of preset parameters from the demographic information, wherein the set of parameters is calculated using threshold and suprathreshold hearing data representative of the demographic information, where the suprathreshold hearing data is generated from one or more suprathreshold hearing tests that measure an ability of one or more test subjects who share the demographic information of the listener to discern a probe tone that is greater than the test subject's auditory thresholds;
   process a voice signal using a sound personalization digital signal processing algorithm; and
   output the processed voice signal to a transducer of the telephonic device.

16. A non-transitory computer readable medium comprising instructions that when executed on a telephonic device, cause a processor of the telephonic device to:
   receive demographic information of a listener;
   retrieve a set of preset parameters from the demographic information, wherein the set of parameters is calculated using threshold and suprathreshold data hearing data representative of the demographic information, the suprathreshold hearing data generated from one or more suprathreshold hearing tests that measure an ability of one or more test subjects who share the demographic information of the listener to discern a probe tone that is greater than the test subject's auditory thresholds;
   process a voice signal using a sound personalization digital signal processing algorithm; and
   output the processed voice signal to a transducer of the telephonic device.

* * * * *